(12) United States Patent
Banerjee et al.

(10) Patent No.: US 12,033,721 B2
(45) Date of Patent: Jul. 9, 2024

(54) SPLIT READ PORT LATCH ARRAY BIT CELL

(71) Applicant: Advanced Micro Devices, Inc., Santa Clara, CA (US)

(72) Inventors: Arijit Banerjee, Austin, TX (US); John J. Wuu, Fort Collins, CO (US); Russell Schreiber, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/359,446

(22) Filed: Jun. 25, 2021

(65) Prior Publication Data

US 2022/0415378 A1 Dec. 29, 2022

(51) Int. Cl.
*G11C 8/16* (2006.01)
*G06F 30/392* (2020.01)
*G11C 11/418* (2006.01)
*G11C 11/419* (2006.01)

(52) U.S. Cl.
CPC .............. *G11C 8/16* (2013.01); *G06F 30/392* (2020.01); *G11C 11/418* (2013.01); *G11C 11/419* (2013.01)

(58) Field of Classification Search
CPC ....... G11C 8/16; G11C 11/418; G11C 11/419; G06F 30/392
USPC ...................................... 365/230.05
See application file for complete search history.

(56) References Cited

U.S. PATENT DOCUMENTS

| | | | |
|---|---|---|---|
| 4,990,999 A | 2/1991 | Oishi et al. | |
| 5,172,335 A | 12/1992 | Sasaki et al. | |
| 5,263,002 A | 11/1993 | Suzuki et al. | |
| 6,560,160 B1 | 5/2003 | Grace | |
| 6,845,059 B1 | 1/2005 | Wordeman et al. | |
| 8,320,163 B2 | 11/2012 | Lee | |
| 9,202,529 B2 | 12/2015 | Kajigaya | |
| 9,401,200 B1* | 7/2016 | Chan | H10B 10/12 |
| 9,916,889 B1* | 3/2018 | Duong | H03K 19/00 |
| 2006/0250880 A1 | 11/2006 | Ramaraju et al. | |

(Continued)

FOREIGN PATENT DOCUMENTS

| | | |
|---|---|---|
| EP | 0929898 B1 | 11/2001 |
| WO | 9814950 A1 | 4/1998 |

OTHER PUBLICATIONS

International Search Report in International Application No. PCT/IB97/01388, dated Mar. 3, 1998, 2 pages.
Banerjee et al., U.S. Appl. No. 17/359,445, entitled "Dual Read Port Latch Array Bit Cell", filed Jun. 25, 2021, 37 pages.
Invitation to Pay Additional Fees, Communication Relating to the Results of the Partial International Search and Provisional Opinion Accompanying the Partial Search Result in International Application No. PCT/US2022/036516, dated Oct. 17, 2022, 11 pages.

(Continued)

*Primary Examiner* — Sung Il Cho
(74) *Attorney, Agent, or Firm* — Kowert, Hood, Munyon, Rankin & Goetzel, P.C.; Rory D. Rankin (57) ABSTRACT

An apparatus and method for providing efficient floor planning, power, and performance tradeoffs of memory accesses. Adjacent bit cells in a column of an array use a split read port such that the bit cells do not share a read bit line while sharing a write bit line. The adjacent bit cells include asymmetrical read access circuits that convey data stored by latch circuitry of a corresponding bit cell to a corresponding read bit line. The layout of adjacent bit cells provides a number of contacted gate pitches per bit cell that is less than a sum of the maximum number of metal gates in layout of each of the adjacent bit cells divided by the number of adjacent bit cells.

14 Claims, 8 Drawing Sheets

(56) References Cited

U.S. PATENT DOCUMENTS

| | | |
|---|---|---|
| 2009/0244950 A1 | 10/2009 | Nii |
| 2011/0216615 A1 | 9/2011 | Nii |
| 2015/0029782 A1* | 1/2015 | Jung .................... G11C 11/419 |
| | | 365/154 |
| 2015/0063040 A1 | 3/2015 | Chan et al. |
| 2015/0248927 A1* | 9/2015 | Fujiwara ................. G11C 5/06 |
| | | 365/72 |
| 2016/0064067 A1 | 3/2016 | Mojumder et al. |
| 2016/0064068 A1* | 3/2016 | Mojumder .......... H01L 29/1054 |
| | | 365/156 |
| 2016/0351252 A1 | 12/2016 | Fujiwara et al. |
| 2019/0325946 A1* | 10/2019 | Lu ......................... G11C 11/419 |
| 2019/0385672 A1 | 12/2019 | Sinangil et al. |
| 2021/0158864 A1 | 5/2021 | Fujiwara et al. |

OTHER PUBLICATIONS

Invitation to Pay Additional Fees, Communication Relating to the Results of the Partial International Search and Provisional Opinion Accompanying the Partial Search Result in International Application No. PCT/US2022/036525, dated Oct. 17, 2022, 11 pages.

Non-Final Office Action in U.S. Appl. No. 17/359,445, dated Nov. 7, 2022, 9 pages.

International Search Report and Written Opinion in International Application No. PCT/US2022/036516, dated Dec. 12, 2022, 19 pages.

International Search Report and Written Opinion in International Application No. PCT/US2022/036525, dated Dec. 13, 2022, 20 pages.

\* cited by examiner

SPLIT READ PORT LATCH ARRAY BIT CELL

BACKGROUND

Description of the Relevant Art

Generally speaking, a variety of semiconductor chips include at least one processing unit coupled to a memory. The processing unit processes instructions (or commands) by fetching instructions and data, decoding instructions, executing instructions, and storing results. The processing unit sends memory access requests to the memory for fetching instructions, fetching data, and storing results of computations. Examples of the processing unit are a central processing unit (CPU), an application specific integrated circuit (ASIC), a field programmable gate array (FPGA), a multimedia engine, and a processing unit with a highly parallel microarchitecture such as a graphics processing unit (GPU) and a digital signa processor (DSP). In some designs, the processing unit and the memory are on a same die such as a system-on-a-chip (SOC), whereas, in other designs, the processing unit and the memory are on different dies within a same package such as a multi-chip-module (MCM) or in a system in a package (SiP). Static random access memory (SRAM) is commonly used as the memory. The SRAM includes an array of many memory bit cells and surrounding circuitry used for accessing values stored in the array.

The die or the package may include other units or components in addition to the processing unit and the memory. The dimensions of the individual components have limits in order to place all of the components on a same die or a same package. For several types of memory, such as the SRAM, the dimensions may exceed limits for efficient placement. The dimensions of the memory, such as the height and/or the width, may be large enough that they interfere with the placement of other components. In some cases, the other components may not even fit within the same die or the same package. Consequently, the chip may be rendered inoperable without significant redesign.

In view of the above, efficient methods and apparatuses for providing efficient floor planning, power, and performance tradeoffs of memory accesses are desired.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Apparatuses and methods for providing efficient floor planning, power, and performance tradeoffs of memory accesses are contemplated. A memory array (or array) utilizes memory bit cells arranged as multiple rows and multiple columns. At least a portion of these multiple memory bit cells utilize split read ports. The array includes multiple rows of memory bit cells (or bit cells) with corresponding multiple read bit lines. In some implementations, the multiple rows of bit cells are the total number of rows of the array. In other implementations, the multiple rows of bit cells are a number of rows in a particular memory bank of multiple banks of the array. The corresponding multiple read bit lines are capable of simultaneously providing requested data that is stored in the multiple rows of bit cells. For example, the corresponding multiple read bit lines simultaneously provide requested data during the execution of multiple read operations in a particular clock cycle. The multiple rows of bit cells include multiple split read ports. As used herein, a "split read port" refers to a particular read bit line of the corresponding multiple read bit lines, and the particular read bit line provides access to a number of memory bit cells less than a total number of memory bit cells.

In one example, the multiple rows of bit cells include a first portion and a second portion. In some implementations, the first portion includes the odd numbered rows of the multiple rows of bit cells, and the second portion includes the even numbered rows of the multiple rows. In another implementation, the first portion includes the even numbered rows and the second portion includes the odd numbered rows. The first portion provides access of data stored in bit cells of the first portion to a first read bit line, but does not provide access to a second read bit line. The second portion provides access of data stored in bit cells of the second portion to the second read bit line, but does not provide access to the first read bit line. Adjacent memory bit cells in a column include a first bit cell from the first portion and a second bit cell from the second portion. Each of the first bit cell and the second bit cell uses asymmetrical read access circuits. As used herein, "an asymmetrical circuit" refers to a circuit that includes a number of p-type transistors different than a number of n-type transistors. In contrast, a symmetrical read access circuit includes a number of p-type transistors equal to a number of n-type transistors. By using asymmetrical read access circuits in the first bit cell and the second bit cell, the adjacent bit cells reduce the on-die area used for placement of the adjacent bit cells in the floorplan. Further details of the split read ports and the asymmetrical read access circuits are provided in the later description of the bit cells. The semiconductor layout (or layout) of the adjacent bit cells takes advantage of the circuit connectivity of the split read ports to minimize a number of contacted gate pitches (CPP) per bit cell. A further description of both the circuits and the layout of the adjacent memory bit cells is provided in the below discussion.

Figure 1:
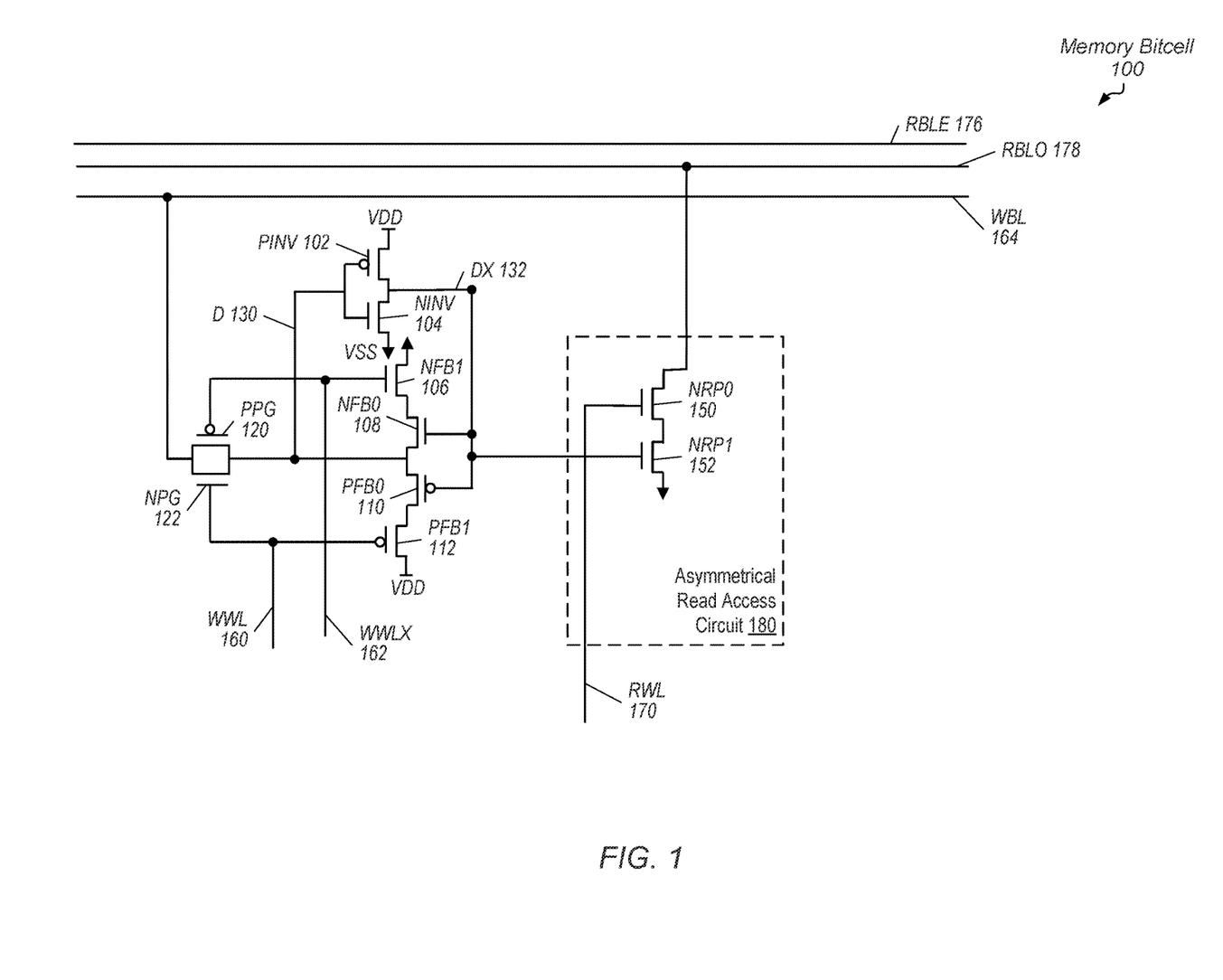
FIG. 1 is a generalized diagram of a memory bit cell that includes an asymmetrical read access circuit and split read ports.

Turning to FIG. 1, a generalized block diagram of one implementation of a memory bit cell 100 that includes an asymmetrical read access circuit and split read ports is shown. In the implementation shown, data storage by a latching element is provided by the memory bit cell 100. For example, the devices 102-112 provide data storage using a back-to-back configuration of an inverter and a tristate inverter. The inverter is implemented with devices 102-104. The tristate inverter is implemented with devices 106-112. The devices 150 and 152 provide a single asymmetrical read access circuit 180 for the memory bit cell 100. The memory bit cell 100 is one implementation of a static RAM (SRAM). In other implementations, another one of various types of RAM cells is used. This "memory bit cell" may also be referred to as the "memory bit cell," the "SRAM bit cell," and "bit cell." In various implementations, the memory bit cell 100 is copied many times and arranged in particular rows and particular columns of a memory array although not in each row and column of the array. The array also includes external circuitry (not shown) such as one or more of row decoders, column decoders, a sense amplifier, pre-charge circuitry, and sequential elements such as latches or flip-flop circuits for storing read access data and write access data.

In some implementations, the array that uses memory bit cell 100 (or bit cell 100) includes read bit lines and write bit lines being routed along columns of the array and read word lines and write word lines being routed along rows of the array. Using this orientation, a column is aligned horizontally in the bit cell 100 along with the routes of the write bit line 164 and the read bit line even (RBLE) 176 and the read bit line odd (RBLO) 178. Using this orientation, a row is aligned vertically in the bit cell 100 along the routes of the read word line RWL 170 and the write word lines WWL 160 and WWLX 162. Although the following discussion uses this orientation, in other implementations, the orientation is rotated with bit lines being routed along rows of the array and word lines being routed along columns of the array. In various implementations, the read bit line RBLE 176 is connected to even numbered rows of the array while being disconnected from odd numbered rows, and the read bit line RBLO 178 is connected to odd numbered rows of the array while being disconnected from even numbered rows. Therefore, the read bit line RBLE 176 is used to provide requested data stored in a targeted even numbered row, and the read bit line RBLO 178 is used to provide requested data stored in a targeted odd numbered row.

The memory bit cell 100 shares the write bit line WBL 164 with other memory bit cells including adjacent memory bit cells in a same column. In one example, bit cell 100 is bit [4] of a data word stored in row 9 of the array. An adjacent bit cell (not shown) that is bit [4] of another data word stored in row 10 of the same array shares write bit line WBL 164 with bit cell 100. Since bit cell 100 is used in an odd numbered row in this example, such as row 9, bit cell 100 is connected to the read bit line RBLO 178. However, in this example, bit cell 100 in row 9 is not connected to the read bit line RBLE 176 used for providing requested data stored in a targeted even numbered row. Bit cell 100 does not share the read bit line RBLO 178 with the adjacent bit cell (now shown) in row 10 in the same column (the same columns for bit[4] in all rows of the array). In other words, this adjacent bit cell (not shown) in row 10 of the same column is not connected to the read bit line RBLO 178. Similarly, an adjacent bit cell (not shown) that is bit [4] of another data word stored in another even numbered row, such as row 8, of the same array does not share read bit line RBLO 178 with bit cell 100. This adjacent bit cell in row 8 of the same column is not connected to the read bit line RBLO 178. Rather, these bit cells (not shown) used to implement bit [4] of other data words stored in even numbered rows, such as rows 8 and 10, of the array share read bit line RBLE 176, which is not connected to any devices of memory bit cell 100 that is used to provide requested data stored in a targeted odd numbered row in this example. Therefore, the array that uses memory bit cell 100 supports a split read bit cell topology. As described earlier, a "split read port" refers to a particular read bit line of the multiple read bit lines corresponding to multiple rows of bit cells, and the particular read bit line provides access to a number of bit cells less than a total number of bit cells in the multiple rows. As shown, a first split read port is implemented with read bit line RBLO 178 and a second split read port is implemented with read bit line RBLE 176.

In various implementations, the devices of memory bit cell 100 are transistors. In some implementations, the transistors are planar metal oxide semiconductor (MOS) field effect transistors (FETs). In other implementations, the devices (or transistors) in the memory bit cell 100 are non-planar transistors. Non-planar transistors are a recent development in semiconductor processing for reducing short channel effects. Tri-gate transistors, Fin field effect transistors (FETs) and gate all around (GAA) transistors are examples of non-planar transistors. As described earlier, bit cell 100 includes asymmetrical read access circuit 180. As described earlier, "asymmetrical" refers to circuits that include a number of p-type transistors different than a number of n-type transistors. As shown, the asymmetrical read access circuit 180 includes two n-type transistors 150 and 152 connected in a series stack topology and zero p-type transistors. Therefore, the number of p-type transistors (e.g., 0) utilized by the asymmetrical read access circuit 180 is different than the number of n-type transistors (e.g., 2) utilized by the asymmetrical read access circuit 180.

When the data storage node D 130 of the memory bit cell 100 has a logic high level, the n-type transistor 104 is enabled and the p-type transistor 102 is disabled. As used herein, a Boolean logic high level is also referred to as a logic high level. Similarly, a Boolean logic low level is also referred to as a logic low level. In various implementations, the logic high level is equal to a power supply reference level and the logic low level is equal to a ground reference level. As used herein, a circuit node or line is "asserted" when the node or line stores a voltage level that enables a transistor that receives the voltage level, or the voltage level indicates an operation is enabled. For example, an n-type transistor is enabled when the n-type transistor receives a positive non-zero voltage level on its gate terminal that is at least a threshold voltage above a voltage level on its source terminal.

As used herein, the circuit node or line is "negated" when the node or line stores a voltage level that disables a transistor that receives the voltage level. An n-type transistor is disabled when the n-type transistor receives a voltage level on its gate terminal that is a threshold voltage below a voltage level on its source terminal. Similarly, a p-type transistor is enabled when the p-type transistor receives a voltage level on its gate terminal that is at least a threshold voltage below a voltage level on its source terminal. The p-type transistor is negated when the p-type transistor receives a voltage level on its gate terminal that is at least a threshold voltage above a voltage level on its source terminal. Additionally, operations are enabled and disabled based on corresponding control signals being asserter or negated. In one example, a write operation is enabled when a write word line is asserted, or the write word line has a voltage level that indicates a write operation is occurring. The write operation is disabled when the write word line is negated, or the write word line has a voltage level that indicates a write operation is not occurring. In some implementations, a write word line is asserted when the write word line has a logic high level, and the write word line is negated when the write word line has a logic low level.

The enabled n-type transistor 104 discharges the node DX 132, which enables the p-type transistor 110 and disables the n-type transistor 108. As used herein, an "n-type transistor" is also referred to as an "n-type device," an "n-type MOSFET," and an "nfet." Additionally, a "p-type transistor" is also referred to as a "p-type device," a "p-type MOSFET," and a "pfet." Therefore, the n-type transistor 108 is also referred to as the nfet 108 and the p-type transistor 110 is also referred to as the pfet 110. It is noted that the n-type transistor 108 is also labeled as NFBO 108 in FIG. 1. The labels used in FIG. 1, such as "NFBO 108" helps to identify transistors and circuit nodes in the circuit diagram of FIG. 1 and equivalent transistors and nodes in semiconductor layout diagrams used in later descriptions such as at least FIG. 2.

When a write operation is not occurring, each of the write word line (WWL) 160 and the complementary write word line (WWLX) 162 is negated. Accordingly, each of the n-type transistor 122 and the p-type transistor 120 of the pass gate is disabled, which electrically disconnects the word line WBL 164 from the node D 130 of the memory bit cell 100. Additionally, each of the n-type transistor 106 and the p-type transistor 112 is enabled, which allows one of the n-type transistor 108 and the p-type transistor 110 to both drive a particular voltage level on the node D 130 based on a voltage level of the node DX 132 and close the data storage loop of the memory bit cell 100. For example, when the node DX 132 stores a logic high level, the n-type transistor 108 is enabled and the p-type transistor 110 is disabled. The n-type transistor 106 is enabled due to the logic high level of WWLX 162, which is negated. The enabled n-type transistors 106 and 108 provide an electrical discharge path between the data storage node D 130 and the ground reference level indicated by "VSS," which maintains the logic low level on the data storage node D 130. The logic low level on the node D 130 enables the p-type transistor 102 and disables the n-type transistor 104. The enabled p-type transistor 102 provides an electrical charging path between the data storage node DX 132 and the power supply reference level indicated by "VDD," which closes the data storage loop. Conversely, when the node DX 132 stores a logic low level, the n-type transistor 108 is disabled and the p-type transistor 110 is enabled. The p-type transistor 112 is enabled due to the logic low level of WWL 160, which is negated when the write operation is not occurring. The enabled p-type transistors 110 and 112 provide an electrical charging path between the data storage node D 130 and VDD, which maintains the logic high level on the data storage node D 130. The logic high level on the node D 130 enables the n-type transistor 104 and disables the p-type transistor 102. The enabled n-type transistor 104 provides an electrical discharging path between the data storage node DX 132 and VSS, which closes the data storage loop.

When a write operation is occurring, external circuitry (not shown) asserts each of WWL 160 and WWLX 162 of memory bit cell 100. The line WWL 160 is asserted with a logic high level and the line WWLX 162 is asserted with a logic low level. Accordingly, each of the p-type transistor 120 and the n-type transistor 122 of the pass gate is enabled. The enabled transistors 120 and 122 of the pass gate electrically connect the word line WBL 164 to the node D 130 of the memory bit cell 100. Therefore, the WBL 164 drives a voltage level to be stored on the node D 130. The write word line WWL 160 is also connected to other memory bit cells in a corresponding row of the array. Each of the n-type transistor 106 and the p-type transistor 112 is disabled, which electrically disconnects the storage loop formation using the data storage nodes D 130 and DX 132. In this implementation, the memory bit cell 100 is a single-ended write bit cell with a single write port. The bit line WBL 164 is driven with write data by an external sequential element and buffer circuitry (not shown) that drives the write data on a column of the array. For write access operations, external circuitry drives a particular voltage level, such as a logic high level or a logic low level corresponding to input data, onto the bit line WBL 164 routed throughout a column. It is noted for memory bit cells not targeted by the write operation, the data storage remains unchanged.

For read access operations, in some implementations, external pre-charge transistors are disabled, a read word line is asserted (such as RWL 170), an external sense amplifier is enabled, and the external read latches are enabled to capture the data read from the targeted memory bit cells. The data stored by the latch element (transistors 102-112) of the memory bit cell 100 is gated from the read bit line RBLO 178 by the asymmetrical read access circuit 180. The inputs to the asymmetrical read access circuit 180 are the node DX 132 and the read word line RWL 170. The output of the asymmetrical read access circuit 180 is the read bit line RBLO 178. The asymmetrical read access circuit 180 includes more n-type transistors than p-type transistors. For example, in the illustrated implementation, the asymmetrical read access circuit 180 includes two n-type transistors 150 and 152 connected in a series stack topology and zero p-type transistors. Therefore, the asymmetrical read access circuit 180 is a circuit that includes a number of p-type transistors different than a number of n-type transistors.

The bit line RBLO 178 is pre-charged to a logic high level such as the power supply reference level "VDD." After the pre-charge cycle (or phase) has ended, when the word line RWL 170 is asserted, the n-type transistor 150 becomes enabled. Whether the n-type transistor 152 is enabled is based on the voltage level stored on the node DX 132. When both n-type transistors 150 and 152 are enabled and the node DX 132 stores a logic high level, this series stack of n-type transistors 150 and 152 discharges the bit line RBLO 178 to a logic low level such as the ground reference level. The n-type transistors 150 and 152 provide the asymmetrical read access circuit 180 that relies on only n-type transistors. This asymmetrical read access circuit uses no p-type transistors. This topology of memory bit cell 100 uses less transistors than a bit cell that uses full complementary tristate inverters to implement read access circuits.

Figure 2:
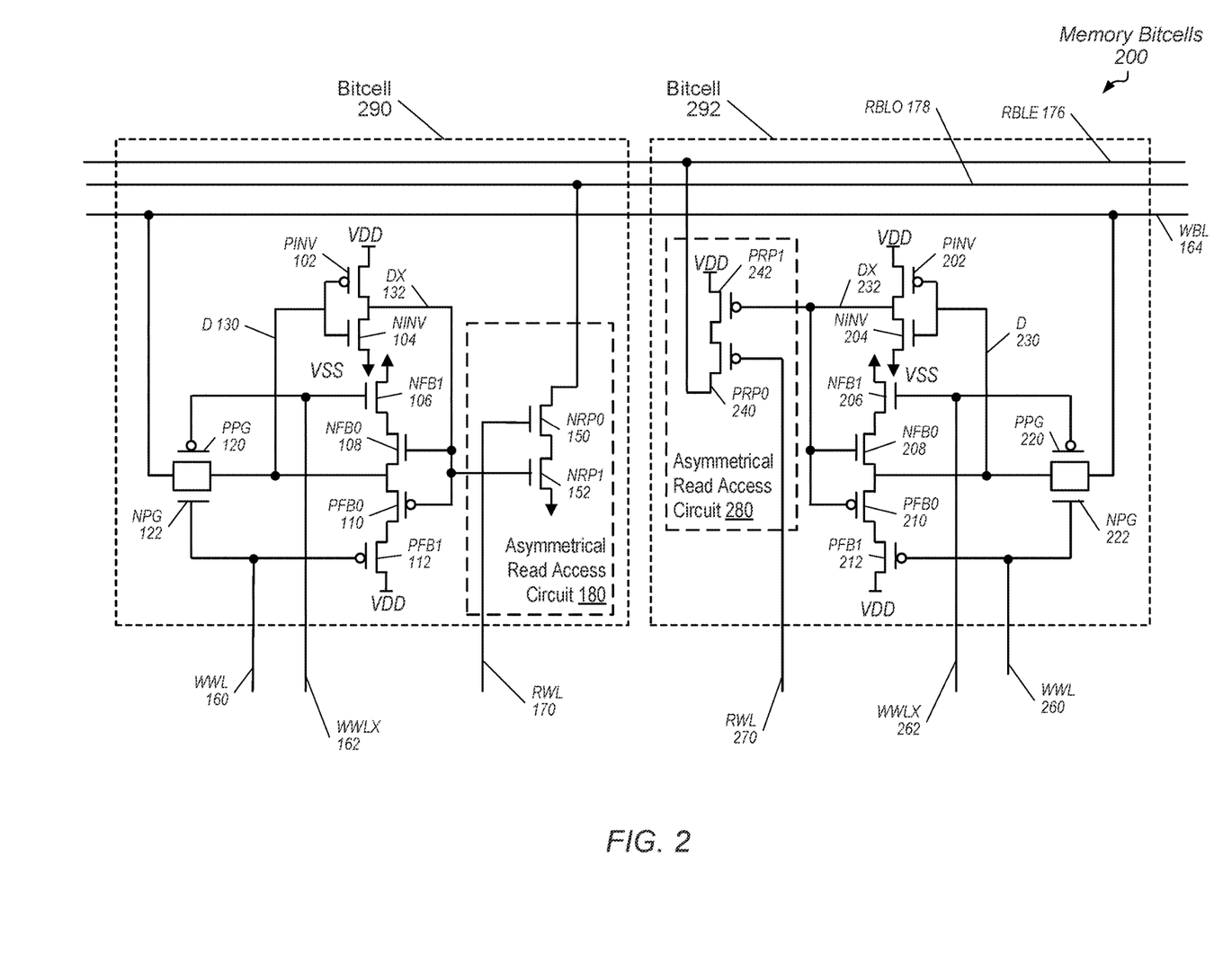
FIG. 2 is a generalized diagram of one implementation of adjacent memory bit cells that utilize asymmetrical read access circuits and split read ports.

Turning to FIG. 2, a generalized block diagram of one implementation of adjacent memory bit cells 200 that utilize asymmetrical read access circuits and split read ports is shown. Signals and circuitry described earlier are numbered identically. In the illustrated implementation, two memory bit cells 290 and 292 are placed in an adjacent manner. In some implementations, the two bit cells 290 and 292 are two adjacent bits of two different rows in a same column of an array. In one example, bit cell 290 is bit [4] of a data word stored in row 9 of a multi-row array and bit cell 292 is bit [4] of another data word stored in row 10 of the same multi-row array. The bit cell 290 uses the same transistors and topology as memory bit cell 100 (of FIG. 1). Similarly, the bit cell 292 uses the same transistors and topology as bit cell 290, but in a mirrored manner, and additionally, the asymmetrical read access circuit 280 uses only p-type transistors and zero n-type transistors. Similarly, bit cell 292 receives control signals 260-270 in a similar manner as bit cell 290 receives control signals 160-170. The memory bit cells 290 and 292 share the write bit line WBL 164. However, the memory bit cells 290 and 292 do not share the read bit lines RBLE 176 and RBLO 178.

As described earlier, for read access operations, external pre-charge transistors are disabled, one or more read word line are asserted (such as RWL 170 and RWL 270), an external sense amplifier is enabled, and the external read latches are enabled. The data stored by the latch element (transistors 102-112) of bit cell 290 is gated from the read bit line RBLO 178 by the asymmetrical read access circuit 180. Similarly, the data stored by the latch element (transistors 202-212) of bit cell 292 is gated from the read bit line RBLE 176 by the asymmetrical read access circuit 280. The bit line RBLE 176 is pre-charged to a logic low level such as the ground reference level "VSS." After the pre-charge cycle (or phase) has ended, when the word line RWL 270 is asserted with a logic low level, the p-type transistor 240 becomes enabled. Whether the p-type transistor 242 becomes enabled is based on the logic level stored on the node DX 232. When both p-type transistors 240 and 242 are enabled and the node DX 232 stores a logic low level, this series stack of p-type transistors 240 and 242 charge the bit line RBLE 176 to a logic high level.

In some implementations, an array uses multiple instantiations of bit cell 290 in odd numbered rows and uses multiple instantiations of bit cell 292 in even numbered rows. In other implementations, the array reverses the usage where odd numbered rows include multiple instantiations of bit cell 292 and even numbered rows include multiple instantiations of bit cell 290. In one example, bit cell 290 is bit [4] of a data word stored in row 9 of the array and bit cell 292 is bit [4] of another data word stored in row 10 of the same array. In this example, bit cell 290 in row 9 does not share the read bit line RBLO 178 with adjacent memory bit cells in the same column such as bit cell 292 in row 10 and another bit cell (now shown), which is an instantiated copy of bit cell 292, in row 8.

Additionally, bit cell 290 does not share the read bit line RBLO 178 with other bit cells (not shown), which are instantiated copies of bit cell 292, in even numbered rows such as row 0, row 2, row 4, row 6, row 8, row 10, row 12 and so on. The bit cells used to implement bit [4] in data words stored in these even numbered rows share the read bit line RBLE 176. The bit cell 290 shares the read bit line RBLO 178 with memory bit cells in the same column, which correspond to bit [4] in one example, with other bit cells (not shown), which are instantiated copies of bit cell 290, in odd numbered rows such as row 1, row 3, row 5, row 7, row 11, row 13 and so on. Therefore, the array that uses bit cells 290 and 292 supports a split read bit cell topology. The read bit line RBLE 176 is a split read port that provides access to half of the number of rows of the total number of rows. Similarly, read bit line RBLO 178 is a split read port that provides access to half of the number of rows of the total number of rows.

Figure 3:
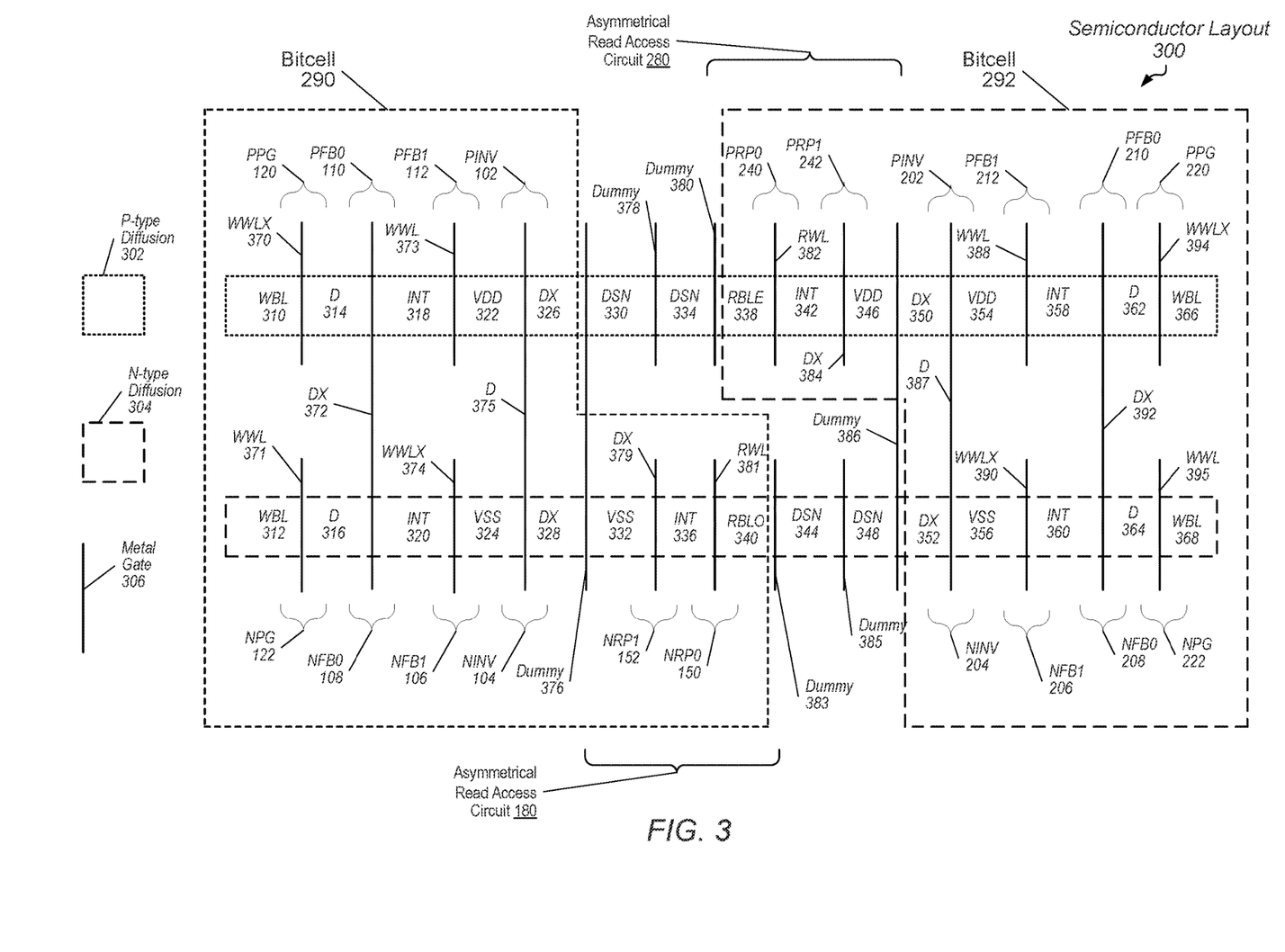
FIG. 3 is a generalized diagram of one implementation of semiconductor layout of adjacent memory bit cells that utilize asymmetrical read access circuits and split read ports.

Referring to FIG. 3, a generalized block diagram of one implementation of semiconductor layout 300 of adjacent memory bit cells that utilize asymmetrical read access circuits and split read ports is shown. Signals and circuitry described earlier are numbered identically. Here, the p-type transistors are at the top of the standard cell layout 300 and the n-type transistors are at the bottom of the standard cell layout 300. It is noted that the dashed boxes for the bit cells 290 and 292 and the braces for the asymmetrical read access circuits 180 and 280 are used to highlight the layout elements of these circuits, and the dashed boxes and the braces are not part of the layout 300. The semiconductor layout (or layout) 300 is semiconductor layout of adjacent memory bit cells such as bit cells 200 (of FIG. 2). As shown, the layout 300 includes transistors 102-242 utilizing source/drain regions 310-368 and receives control signals 370-395 received on metal gates. As shown, the layout 300 uses metal gate 306 in a vertical direction and diffusion regions 302 and 304 used to define active regions in a horizontal direction. For example, p-type diffusion region 302 defines a p-type active region in the layout 300, whereas, the n-type diffusion region 304 defines an n-type active region in the layout 300. It is noted that it is possible to rotate the standard cell layout 200 to have a different orientation.

Similar to the transistors of bit cells 200 (of FIG. 2), in some implementations, the transistors in the layout 300 are planar metal oxide semiconductor (MOS) field effect transistors (FETs). In other implementations, the devices (or transistors) of the layout 200 are non-planar transistors such as tri-gate transistors, Fin field effect transistors (Fin-FETs), and gate all around (GAA) transistors. In some implementations, the source/drain regions are implemented with trench silicide contacts. Trench silicide contacts used for source/drain regions, signal routes in different metal layers, contacts and vias, and so forth are not shown in layout 300 for ease of illustration. As shown, the p-type transistors 102, 110, 112, 120, 202, 210, 212 and 220, 240 and 242 are placed in a particular order. Similarly, the n-type transistors 104, 106, 108, 122, 150, 152, 204, 206, 208 and 222 are placed in a particular order.

In some implementations, the layout of each of the bit cells 290 and 292 is an L-shaped layout, rather than a rectangle-shaped layout. The dashed boxes for the bit cells 290 and 292 illustrate the L-shaped layout and the different edges. As used herein, an "L-shaped layout of a bit cell" refers to layout of a bit cell that includes a number of metal gates formed over a particular type of diffusion different than a number of metal gates formed over another diffusion of a type that is an opposite polarity of the particular type of diffusion. For example, the dashed box of the layout of bit cell 290 includes a number of four metal gates formed over the p-type diffusion 302, which is different than a number of seven metal gates of the bit cell 290 formed over the n-type diffusion 304. Similarly, the dashed box of the layout of bit cell 292 includes a number of seven metal gates formed over the p-type diffusion 302, which is different than a number of four metal gates of the bit cell 292 formed over the n-type diffusion 304.

Dummy gates are typically used to provide electrical isolation between regions. Although in various implementations, a dummy gate uses a metal gate, the gate region is formed over an insulation layer, rather than an active silicon layer such as an n-type or p-type diffusion layer. The isolation layer uses a silicon nitride layer, a silicon oxide layer, such as a silicon dioxide layer, or another type of dielectric layer. Therefore, should voltage levels be applied on the dummy gate and one or more of the regions on either side of the dummy gate, such as source/drain regions, no electrical path is provided and no current flows between the source/drain regions. The fabrication steps for the dummy gate ensures that an active transistor is not formed at the location in the layout of the dummy gate. In some implementations, standard cell layouts use dummy gates at the edges of the cell layout. In these cases, dummy gates are typically used to separate cells from one another. For example, an edge of a cell has a last active metal gate, followed by active diffusion, and then a dummy gate. In some designs, two adjacent cells share a dummy gate. However, as shown in the illustrated implementation, the layout 300 has no dummy gates at the outermost edges. Rather, the layout 300 uses multiple dummy gates 376, 378, 380, 383, 385 and 386 in the middle of the layout 300.

In some implementations, one or more of the dummy gates 376, 378, 380, 383, 385 and 386 are left floating, whereas, in other implementations, one or more of these dummy gates are connected to one of VDD and VSS. Despite using metal gates, the dummy gates 376 and 386 of layout 300, which are routed over both the p-type active region and the n-type active region, are formed on top of a dielectric layer, rather than on top of an active region, and consequently, are incapable of conducting current. In some implementations, one or more of the dummy gates 378, 380, 383 and 385, which are routed over only one of the p-type active region and the n-type active region, are also formed on top of a dielectric layer, and consequently, are incapable of conducting current. In other implementations, one or more of the dummy gates 378, 380, 383 and 385 are formed over only a single active region, but are connected to a voltage level that disables the resulting transistor. For example, if one or more of dummy gates 378 and 380, which are routed over only the p-type active region, are also formed on top of the active region rather than a dielectric layer, then these dummy gates are connected to the power supply reference VDD to disable the resulting transistor.

In another example, if one or more of dummy gates 383 and 385, which are routed over only the n-type active region, are formed on top of the active region rather than a dielectric layer, then these dummy gates are connected to the ground reference VSS to disable the resulting transistor. Therefore, the source/drain region DX 326 is electrically isolated from the source/drain region RBLE 338. Similarly, the source/drain region DX 328 is electrically isolated from the source/drain region VSS 332. Additionally, the source/drain region VDD 346 is electrically isolated from the source/drain region DX 350, and the source/drain region RBLO 340 is electrically isolated from the source/drain region DX 352, and so on.

In bit cell 290, a first metal gate 370 is placed over only p-type diffusion capable of receiving a first write word line. Therefore, the first metal gate 370 is placed over a p-type active region used for creating p-type transistors. The first metal gate 370 is used to implement a p-type transistor of a pass gate such as PPG 120 (of FIGS. 1-2). Using the signals described previously, in an implementation, the source/drain region labeled WBL 310 at the first edge is later electrically connected to the signal WBL 164 (of FIG. 1). The source/drain region labeled D 314 on the other side of the first metal gate 370 is later electrically connected to the source/drain region D 316, and after the later connections, both of these source/drain regions 314 and 316 are logically equivalent to the signal D 130 (of FIG. 1). Similarly, later fabrication steps electrically connect the first metal gate WWLX 370 to the metal gate WWLX 374, and after the later connections, both of these metal gates 370 and 374 are logically equivalent to the signal WWLX 162 (of FIG. 1).

In bit cell 290, a second metal gate 371 is placed over only n-type diffusion 304, which is capable of receiving the signal WWL 160 (of FIG. 1) when later electrical connections are formed with contacts, vias and other metal layers. Therefore, the second metal gate 371 is placed over an n-type active region used for creating n-type transistors. The second metal gate 371 is used to implement an n-type transistor of the pass gate such as NPG 122 (of FIGS. 1-2). However, here, the signals are physically disconnected at the source/drain regions and at the metal gates until further layers and contacts are placed to electrically connect nodes to one another. Therefore, signals that are named identically to one another in FIG. 2 and named identically with signals described earlier in the memory bit cell 100 (of FIG. 1) are numbered differently in the layout 200 due to the signals identifying different physical elements of layout 200. For example, the data storage nodes D 314 and D 316 are logically equivalent, but the p-type active region forming the source/drain region for node D 314 does not physically abut with the n-type active region forming the source/drain region for node D 316. Therefore, the nodes D 314 and D 316 are not physically connected at the source/drain regions. However, the nodes D 314 and D 316 are physically connected after further metal layers, vias and contacts are placed by semiconductor fabrication steps.

When the semiconductor fabrication steps place the further metal layers, vias and contacts, which are not shown for ease of illustration, the nodes D 314 and D 316 become physically connected. This physical connection allows the nodes D 314 and D 316 to become electrically connected when voltage levels are applied to the layout 300. Similarly, the write word lines WWL 371 and WWL 373 are logically equivalent, but the metal gate of WWL 371 does not physically abut with the metal gate of WWL 373. Therefore, the write word lines WWL 371 and WWL 373 are not physically connected at the metal gates. However, the write word lines WWL 371 and WWL 373 are physically connected after further layers and contacts are placed by the semiconductor fabrication steps. When the semiconductor fabrication steps place the further metal layers, vias and contacts, the write word lines WWL 371 and WWL 373 become physically connected. This physical connection allows the write word lines WWL 371 and WWL 373 to become electrically connected when voltage levels are applied to the layout 300.

In a similar manner as described earlier, a third metal gate 394 is placed over only p-type diffusion at the right edge of layout 300 capable of receiving the signal WWLX 262 (of FIG. 2). The third metal gate 394 is used to implement a p-type transistor of a pass gate such as PPG 220 (of FIG. 2). Using the signals described previously, in an implementation, the source/drain region labeled WBL 366 at the right edge is later electrically connected to WBL 164 (of FIG. 1), the source/drain region labeled D 362 on the other side of the third metal gate 394 is later electrically connected to D 230 (of FIG. 2), and the third metal gate 394 is later electrically connected to WWLX 262 (of FIG. 2).

In a similar manner, a fourth metal gate 395 is placed over only n-type diffusion 304 at the right edge of layout 300 capable of receiving the signal WWL 260 (of FIG. 2). The fourth metal gate 395 is used to implement an n-type transistor of the pass gate such as NPG 222 (of FIG. 2). Using the signals described previously, in an implementation, the source/drain region labeled as WBL 368 on the n-type diffusion 304 at the fourth edge is later electrically connected to WBL 164, the source/drain region labeled as D 364 on the other side of the fourth metal gate 395 is later electrically connected to D 230, and the fourth metal gate 395 is later electrically connected to WWL 260.

The dummy gate 376 is placed over both p-type diffusion and n-type diffusion. Using the signals described previously, in an implementation, the source/drain region labeled DX 326 on the p-type diffusion 302 is later electrically connected to DX 132, and the source/drain region labeled DSN 330 on the other side of the dummy gate 376 on the p-type diffusion 302 is used to isolate bit cell 290 from bit cell 292. It is noted that along the p-type diffusion 302, the bit cell 290 ends at the dummy gate 376. The source/drain region labeled RBLE 338 that is electrically connected to RBLE 176 is within the bit cell 292. The source/drain region labeled DX 328 on the n-type diffusion 304 is later electrically connected to DX 132, and the source/drain region labeled VSS 332 on the other side of dummy gate 376 on the n-type diffusion 304 is later electrically connected to the ground reference level. The dummy gate 386 is placed over both p-type diffusion 302 and n-type diffusion 304 within the bit cell 292. The source/drain region labeled VDD 346 on the p-type diffusion 304 is later electrically connected to the power supply reference level, and the source/drain region labeled DX 350 on the p-type diffusion 302 is later electrically connected to DX 232.

The layout 300 includes other dummy gates such as dummy gates 378, 380, 383 and 385 between bit cells 290 and 292. The layout 300 includes source/drain regions that are labeled with a signal name DSN (Dummy Structure Node) followed by a callout number. The signal name DSN is used to indicate that these nodes are used with dummy gates and they remain floating. The source/drain regions labeled DSN 330 and DSN 334 are used with dummy gates 376, 378 and 380 to isolate bit cell 290 from bit cell 292 along the p-type diffusion 302. The source/drain regions labeled DSN 344 and DSN 348 are used with dummy gates 383, 385 and 386 to isolate bit cell 290 from bit cell 292 along the n-type diffusion 304. Other source/drain regions are labeled with a signal name INT (Intermediate) followed by a callout number. The signal name INT is used to indicate that these nodes are intermediate nodes between transistors. For example, INT 318 is the source/drain region between the two p-type transistors PFB0 110 and PFB1 112. Unlike other source/drain regions and metal gates that are capable of enabling transistors (unlike the dummy gates), the source/drain regions labeled with INT do not have additional layers, contacts and vias connected to them.

The layout 300 is characterized by a number of contacted gate pitches (CPP). The acronym CPP is used, since metal gates may be formed using polysilicon, so there would be a number of contacted polysilicon (poly) pitches, or CPP, in the layout 300. However, metal gates may now also be formed from a variety of other materials. Titanium nitride (TiN) is one example of material used to form metal gates in layout 300. Although other materials may be used to form the metal gates of layout 300, the acronym CPP is still used to indicate the number of contacted gate pitches. The placement of other nodes of layout 300 is completed in a manner that when CPP is calculated for layout 300, the CPP is fourteen for the adjacent bit cells 290 and 292 of layout 300. For example, as shown in layout 300, a number of metal gates formed over the p-type diffusion 302 is fourteen. Similarly, a number of metal gates formed over the n-type diffusion 304 in layout 300 is fourteen. The total CPP of layout 300 of the two adjacent bit cells 290 and 292 is fourteen. The CPP per bit cell of layout 300 is fourteen divided by two bit cells, which is seven per bit cell.

As described above, the placement of other nodes of layout 300 is completed in a manner that also provides a CPP per bit cell equal to one more than a maximum of a first number and a second number where the first number is a number of p-type transistors in a particular bit cell and the second number is a number of n-type transistors in the particular bit cell. For example, the bit cell 290 has four p-type transistors and six n-type transistors, which provides a maximum value of six. The CPP of bit cell 290 is one more than six, which is seven. Similarly, the bit cell 292 has six p-type transistors and four n-type transistors, which provides a maximum value of six. The CPP of bit cell 292 is one more than six, which is seven.

It is noted that when a particular bit cell uses symmetrical circuitry externally from the asymmetrical read access circuit of the particular bit cell, the CPP of the particular bit cell is equal to one more than a number of transistors in the particular bit cell of a corresponding transistor type used in the asymmetrical read access circuit. For example, referring briefly again to adjacent bit cells 290 and 292 (of FIG. 2), bit cell 290 uses symmetrical circuitry externally from the asymmetrical read access circuit 180. For example, the external circuitry of bit cell 290 uses four p-type transistors 102, 110, 112 and 120. The external circuitry of bit cell 290 also uses four n-type transistors 104, 106, 108 and 122. The bit cell 290 uses n-type transistors in the asymmetrical read access circuit 180. A number of n-type transistors in bit cell 290 is six. The CPP per bit cell of bit cell 290 is one more than six, which is seven. Bit cell 292 also uses symmetrical circuitry externally from the asymmetrical read access circuit 280. Bit cell 292 uses p-type transistors in the asymmetrical read access circuit 280. A number of p-type transistors in bit cell 292 is six. The CPP per bit cell of bit cell 292 is one more than six, which is seven.

Figure 4:
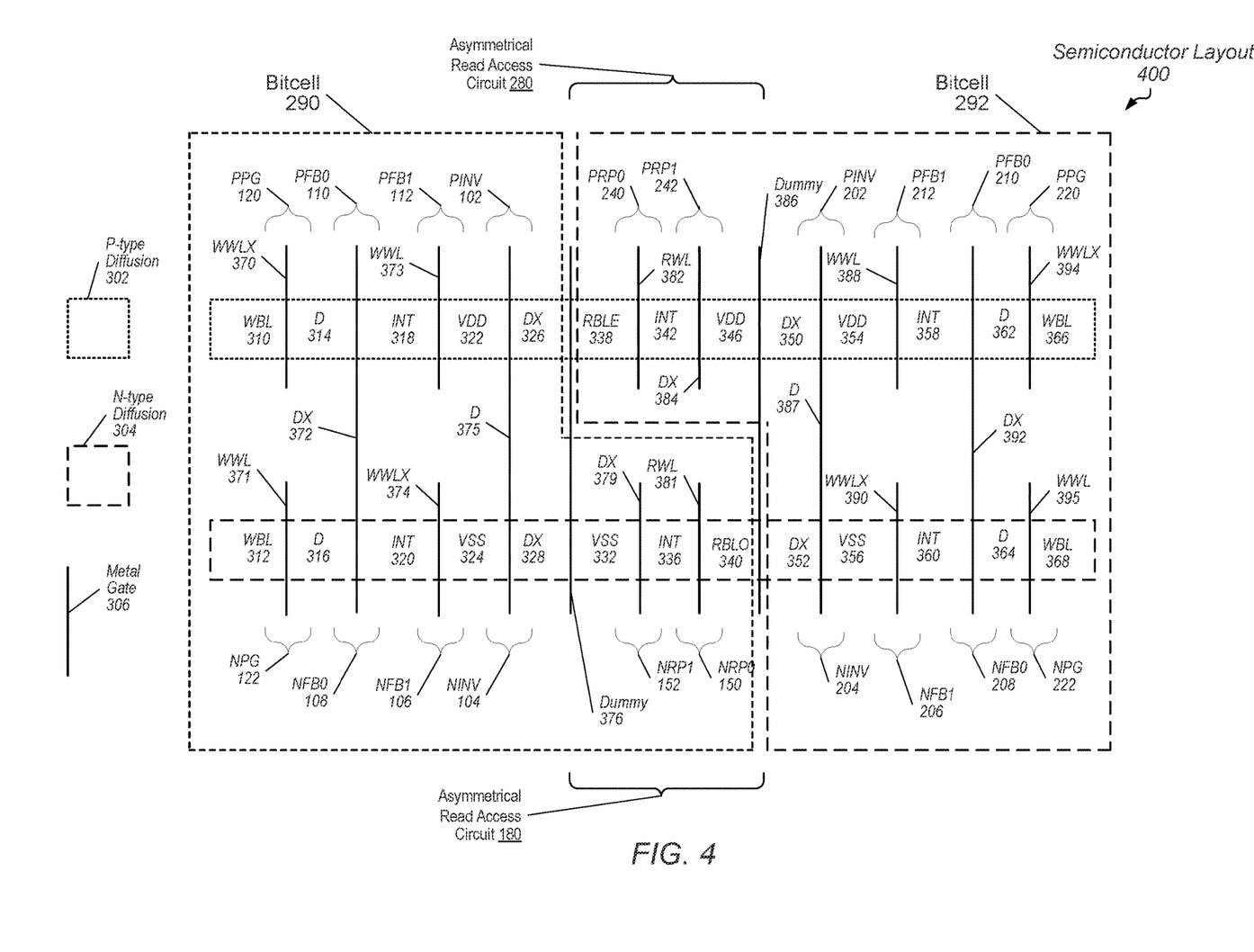
FIG. 4 is a generalized diagram of another implementation of semiconductor layout of adjacent memory bit cells that utilize asymmetrical read access circuits and split read ports.

Turning now to FIG. 4, a generalized block diagram of one implementation of semiconductor layout 400 of adjacent memory bit cells that utilize asymmetrical read access circuits and split read ports is shown. Signals and circuitry described earlier are numbered identically. Similar to the layout 300, the layout 400 is semiconductor layout of adjacent memory bit cells such as bit cells 200 (of FIG. 2). The layout of each of the bit cells 290 and 292 is an L-shaped layout, rather than a rectangle-shaped layout. The dashed boxes for the bit cells 290 and 292 illustrate the L-shaped layout. Similar to the layout 300, the dashed box of the layout of bit cell 290 of layout 400 includes a number of four metal gates formed over the p-type diffusion 302, which is different than a number of seven metal gates formed over the n-type diffusion 304. The dashed box of the layout of bit cell 292 includes a number of seven metal gates formed over the p-type diffusion 302, which is different than a number of four metal gates formed over the n-type diffusion 304. It is noted that compared to layout 300, the source/drain regions labeled DSN 330, DSN 334, DSN 344 and DSN 348 and the dummy gates 378, 380, 383 and 385 are removed and not used in layout 400. The layout 400 includes two dummy gates 376 and 386, each routed over both p-type diffusion 302 and n-type diffusion 304. Along the p-type diffusion 302, the bit cell 290 ends at the dummy gate 376. Additionally, along the n-type diffusion 304, the bit cell 290 ends at the dummy gate 386.

The placement of other nodes of layout 400 is completed in a manner that provides a number of contacted gate pitches per bit cell equal to a ratio of a first number to a second number, which is (A/B). The first number is a difference between a third number and a fourth number, or A=C−D. In other words, the number of contacted gate pitches per bit cell is equal to (C−D)/B. The second number, B, is a number of adjacent bit cells in the layout, which is two bit cells (e.g., bit cells 290 and 292). The third number, C, is a sum of the maximum number of metal gates (contacted signal nodes and dummy gates) over either of the active regions in each of the adjacent bit cells (e.g., bit cells 290 and 292). The layout of each of the bit cells 290 and 292 has a maximum number of 7 metal gates over one of the p-type active region and the n-type active region. For example, the layout of bit cell 290 has a maximum number of metal gates of 7 over the n-type active region from metal gate WWL 371 on the left of the layout to the metal gate RWL 381 on the right of the layout. The layout of bit cell 292 has a maximum number of metal gates of 7 over the p-type active region from metal gate RWL 382 on the left of the layout to the metal gate WWLX 394 on the right of the layout. Therefore, the sum is 7+7, or 14. It is noted that due to the L-shaped layout, the maximum number of metal gates (contacted signal nodes and dummy gates) over either of the active regions in each of the adjacent bit cells does not equal the minimum number of metal gates (contacted signal nodes and dummy gates) over either of the active regions in each of the adjacent bit cells. Taking bit cell 290 as an example, this minimum number of metal gates is 4 from metal gate WWLX 370 on the left of the layout to the metal gate D 375 on the right of the layout over the p-type active region.

The fourth number, D, is a sum of contacted metal gates (not dummy gates) of a bit cell over a single active region that would intersect the layout of the other bit cell if the contacted metal gates were extended to route over the other active region. For example, metal gate RWL 382 is a contacted metal gate in the layout of bit cell 290 that is placed over a single active region (e.g., p-type active region). Metal gate RWL 382 would intersect with the layout of bit cell 292 if the metal gate RWL 382 was extended to route over the other active region (e.g., n-type active region). Similarly, this description applies to the contacted metal gate DX 384. Therefore, the bit cell 290 provides the fourth number, D, as 2. In a similar manner, the description for the fourth number, D, applies to the contacted metal gates DX 379 and RWL 381 of the layout of bit cell 292. Therefore, the number of contacted gate pitches per bit cell is equal to (C−D)/B, or (14−2)/2, which is 6 CPP per bit cell. It is noted that using this formula for layout 300 (of FIG. 3) provides the number of contacted gate pitches per bit cell equal to (C−D)/B, or (18−4)/2, which is 7 CPP per bit cell.

It is noted that due to each of the two bit cells 290 and 292 utilizing an L-shaped layout, the number of contacted gate pitches (CPP) per bit cell for the adjacent bit cells 290 and 292 is less than a sum of the maximum number of metal gates (contacted signal nodes and dummy gates) in the layout of each of the adjacent bit cells 290 and 292 divided by the number of adjacent bit cells, which is two bit cells. The maximum number of metal gates (contacted signal nodes and dummy gates) in the layout of each of the bit cells 290 and 292 is 7. Therefore, the sum is 14. The sum of 14 divided by the number of 2 bit cells is 7 CPP per bit cell. However, the achieved number of contacted gate pitches per bit cell is 6 CPP per bit cell. The layout of the adjacent bit cells 290 and 292 achieves the smaller number of contacted gate pitches per bit cell by utilizing the L-shaped layout. For the bit cells 290 and 292, the placement of other nodes of the layout of the adjacent bit cells is completed in a manner that provides the reduced number of contacted gate pitches per bit cell equal to 6 CPP per bit cell.

Figure 5:
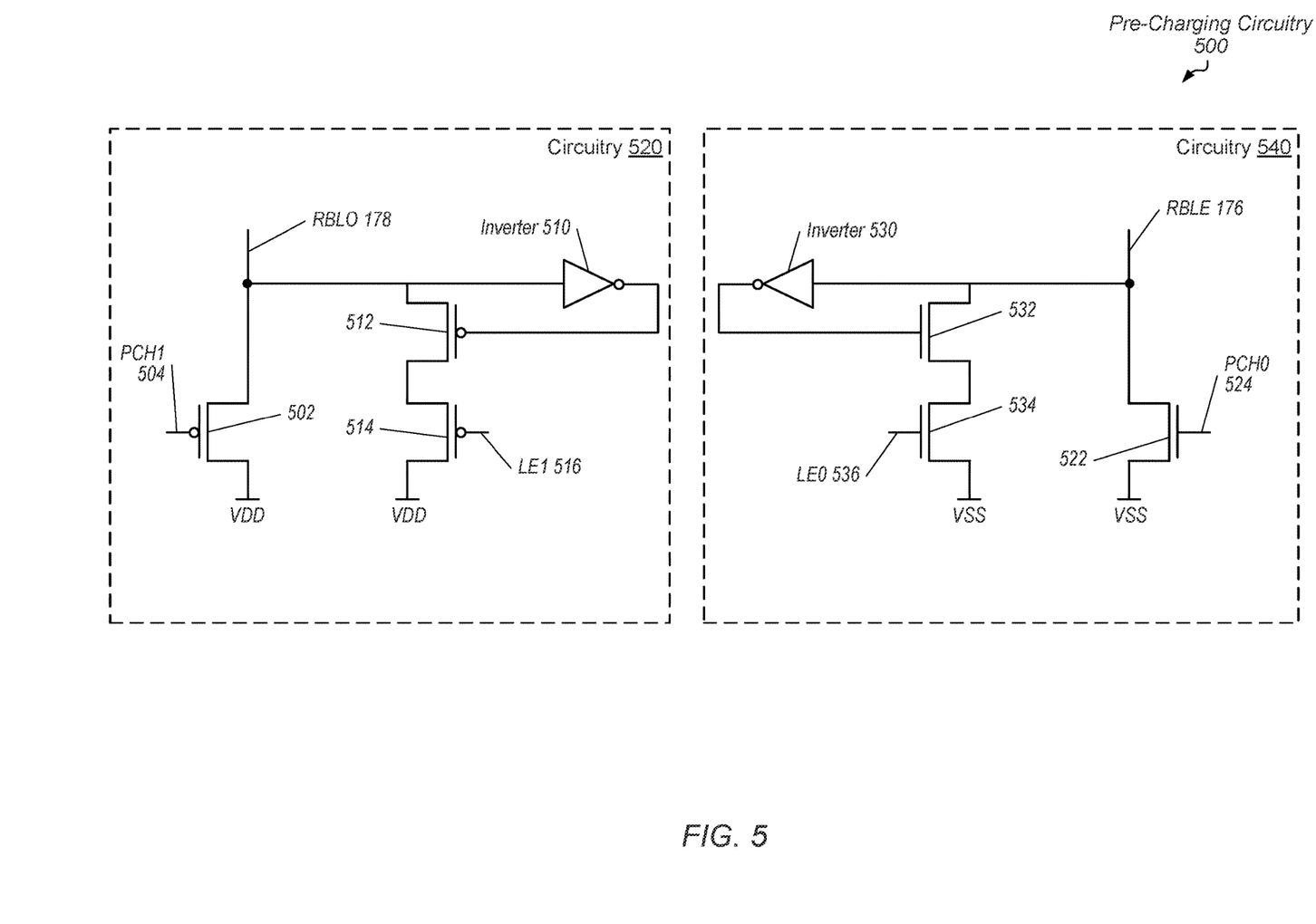
FIG. 5 is a generalized diagram of one implementation of pre-charging circuitry of a memory that utilizes memory bit cells with asymmetrical read access circuits and split read ports.

Turning now to FIG. 5, a generalized block diagram of one implementation of pre-charging circuitry 500 is shown. Signal names previously described are numbered identically. For example, the read bit lines RBLE 176 and RBLO 178 are the read bit lines from the memory bit cells 100-200 (of FIGS. 1-2). As shown, circuitry 500 includes pre-charging circuitry (or circuitry) for two read bit lines. Circuitry 520 pre-charges the read bit line RBLO 178, which is connected to an asymmetrical read access circuit that uses only n-type transistors. Circuitry 520 includes the pre-charge p-type transistor 502, an inverter 510, and the p-type transistors 512 and 514 in a series stack topology. The pre-charge p-type transistor 502 receives a pre-charge control signal PCH1 504. The transistor 514 receives the control signal LE1 516. Circuitry 540 pre-charges the read bit line RBLE 176, which is connected to an asymmetrical read access circuit that uses only p-type transistors. Circuitry 540 includes the pre-charge transistor 522, an inverter 530, and the transistors 532 and the 534 in a series stack topology. The pre-charge transistor 522 receives a pre-charge control signal PCH0 524, and the transistor 522 receives the control signal PCH0 524. A further description of the operation of the circuitry 520 is provided in the below discussion. Similar steps are used to operate the circuitry 540.

During a pre-charge phase, the control signal PCH1 504 is asserted, the p-type transistor 502 is enabled, and the enabled transistor 502 creates an electrically conducting path between the power supply voltage reference level "VDD" and the read bit line RBLO 178. When RBLO 178 is pre-charged to the power supply reference level, the inverter 510 discharges the gate terminal of the p-type transistor 512, which enables the transistor 512. The transistor 512 is used as a keeper transistor. In some implementations, circuitry 520 uses a single keeper transistor, such as transistor 512, with no transistor 514. In other implementations, circuitry 520 uses the series stack as shown with the two p-type transistors 512 and 514 providing one of a variety of split keeper (or dual keeper) schemes. For example, the two p-type transistors 512 and 514 provide one of a variety of delayed onset keeper circuitry. During an evaluate phase, the control signal PCH1 504 is negated, and the transistor 502 is disabled. The voltage level on the read bit line RBLO 178 is based at least on a voltage level provided by the asymmetrical read access circuitry of a selected bit cell.

Figure 6:
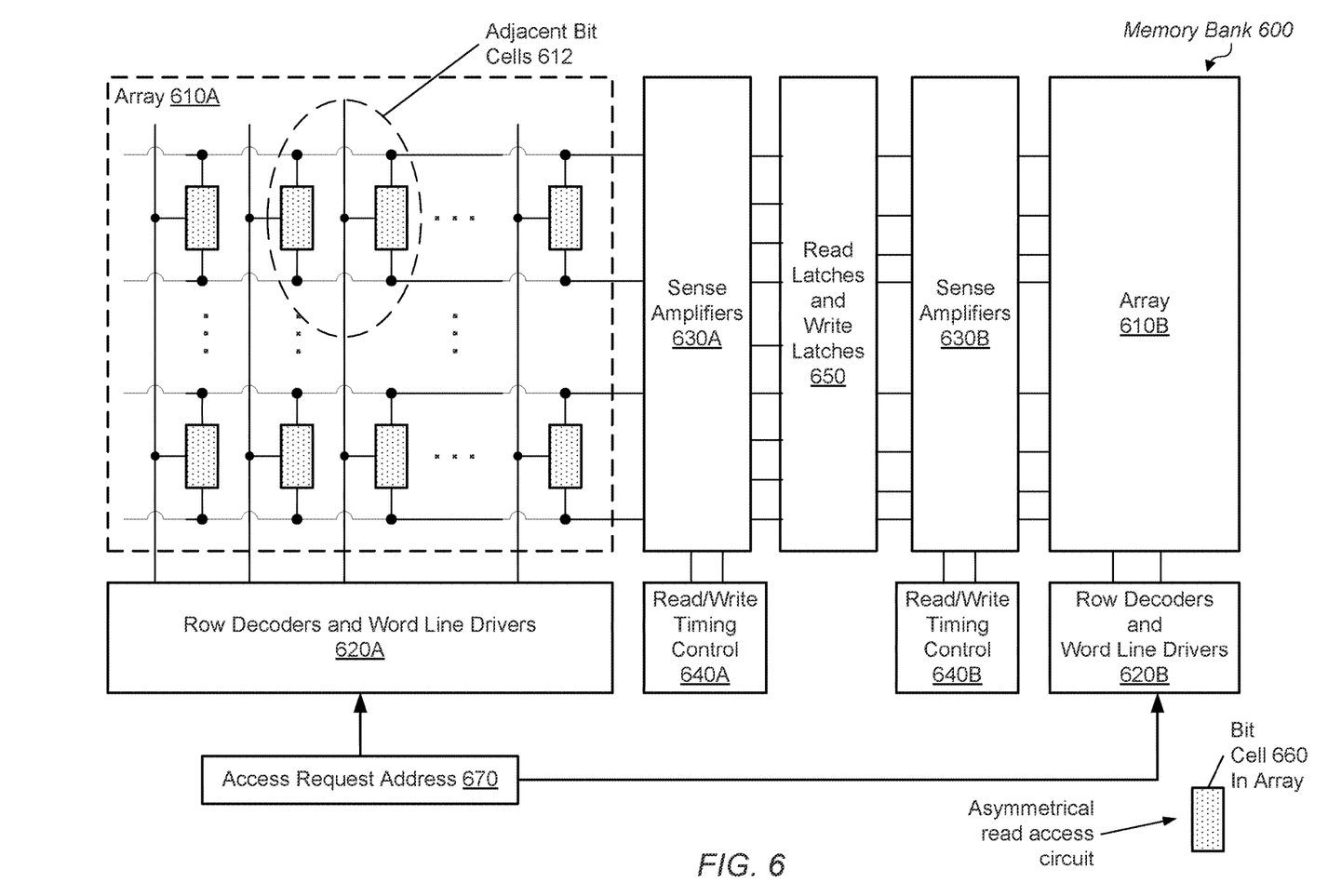
FIG. 6 is a block diagram of an implementation of a memory bank that utilizes memory bit cells with asymmetrical read access circuits and split read ports.

Turning now to FIG. 6, a generalized block diagram of one implementation of a memory bank 600 is shown. In various implementations, a memory is organized as multiple memory banks, and a memory macro block includes both a left bank and a right bank. In some implementations, the bank 600 is one of the left bank or the right bank of the memory macro block. Although "left" and "right" are used to describe the memory banks, other notations may be used such as a "top bank" and a "bottom bank." As shown, the memory bank 600 includes arrays 610A-610B, row decoders 620A-620B, sense amplifiers 630A-630B between the arrays 610A-610B, read and write timing control logic 640A-640B, and read latches and write latches in block 650. It is noted that, in some implementations, multiple banks are accessed concurrently in a same clock cycle or a same pipeline stage. The access includes one of a read access and a write access. In such implementations, bank address decoders select the corresponding banks to access.

In various implementations, each of the blocks 610A-610B, 620A-620B, 630A-630B, 640A-640B and 650 in the memory bank 600 is communicatively coupled to another one of the blocks. For example, direct connections are used wherein routing occurs through another block. Alternatively, staging of signals is done in an intermediate block. In various implementations, each of the arrays 610A-610B includes multiple memory bit cells 660 arranged in a tiled format. Here, the rows are aligned with the tracks used for the routing of the word lines of the array such as in the vertical direction in the illustrated implementation. The columns are aligned with the tracks used for the routing of the bit lines of the array such as in the horizontal direction in the illustrated implementation. In various implementations, the multiple rows of array 610A include a first portion of rows connected to a first read bit line and disconnected from a second read bit line. Additionally, the multiple rows of array 610A include a second portion of rows connected to the second read bit line and disconnected from the first read bit line. Therefore, the array 610A utilizes a split read port. In various implementations, the array 610B is an instantiated copy of the array 610A.

In some implementations, the first portion of rows of the array 610A includes the odd numbered rows of the multiple rows, and the second portion of rows of the array 610A includes the even numbered rows of the multiple rows. In another implementation, the assignment is reversed with the even numbered rows in the first portion of rows and the odd numbered rows in the second portion of rows. A pair of adjacent memory bit cells include a first memory bit cell in the first portion of rows and a second memory bit cell in the second portion of rows. One pair of adjacent memory bit cells 612 is highlighted with the dashed ellipse in the array 610A. In an example, a first memory bit cell (or first bit cell), which is the left-most bit cell within the adjacent bit cells 612, is bit [4] of a data word stored in row 9 of the array 610A. The second bit cell, which is the right-most bit cell within the adjacent bit cells 612, is bit [4] of another data word stored in row 10 of the array 610A. The first bit cell and the second bit cell share a write bit line. However, in various implementations, the first bit cell and the second bit cell do not share a read bit line. In some implementations, the adjacent bit cells 612 utilize the layout 400 (of FIG. 4).

In some implementations, one or more of the bit cells include asymmetrical read access circuits. For example, the bit cells of the second portion of rows include a stack of p-type transistors, such as p-type transistors 240 and 242 (of FIG. 2), that control whether the stored binary value affects the pre-charged read bit line RBLE 166. In addition, the bit cells of the first portion of rows include a stack of n-type transistors, such as n-type transistors 150 and 152 (of FIGS. 1-2), that control whether the stored binary value affects the pre-charged read bit line RBLO 168.

The row decoders and word line drivers in blocks 620A-620B receive address information corresponding to an access request. For example, each of the blocks 620A-620B receives the information provided by the access request address 670. Each one of the blocks 620A-620B selects a particular row, or entry, of the multiple rows in an associated one of the arrays 620A-620B. In some implementations, the blocks 620A-620B use an index portion of the address 670 for selecting a given row, or entry, in an associated one of the arrays 620A-620B. Each row, or entry, stores one or more memory lines.

In the implementation shown, the rows, or entries, in the arrays 620A-620B are arranged in a vertical orientation. However, in other implementations, a horizontal orientation is used for storage of the memory lines. For write access requests, the write latches are located in block 650. The write data is driven into the arrays 610A-610B. The timing control logic 640A-640B updates the write latches with new data in block 650 and sets up the write word line driver logic. The write data is written into a row of bit cells that is selected by an associated one of the blocks 620A-620B. In some implementations, pre-charge circuitry is included in block 650.

For read access requests, the block 650 is used to pre-charge the read bit lines routed to the arrays 610A-610B. The timing circuitry in blocks 640A-640B is used for pre-charging and setting up the sense amplifiers in the blocks 630A-630B. The timing circuitry 640A-640B sets up the read word line driver logic. One of the row decoders 620A-620B selects a row to read out data, which will be provided on read bit lines that are sensed by the sense amplifiers. The read latches capture the read data.

Figure 7:
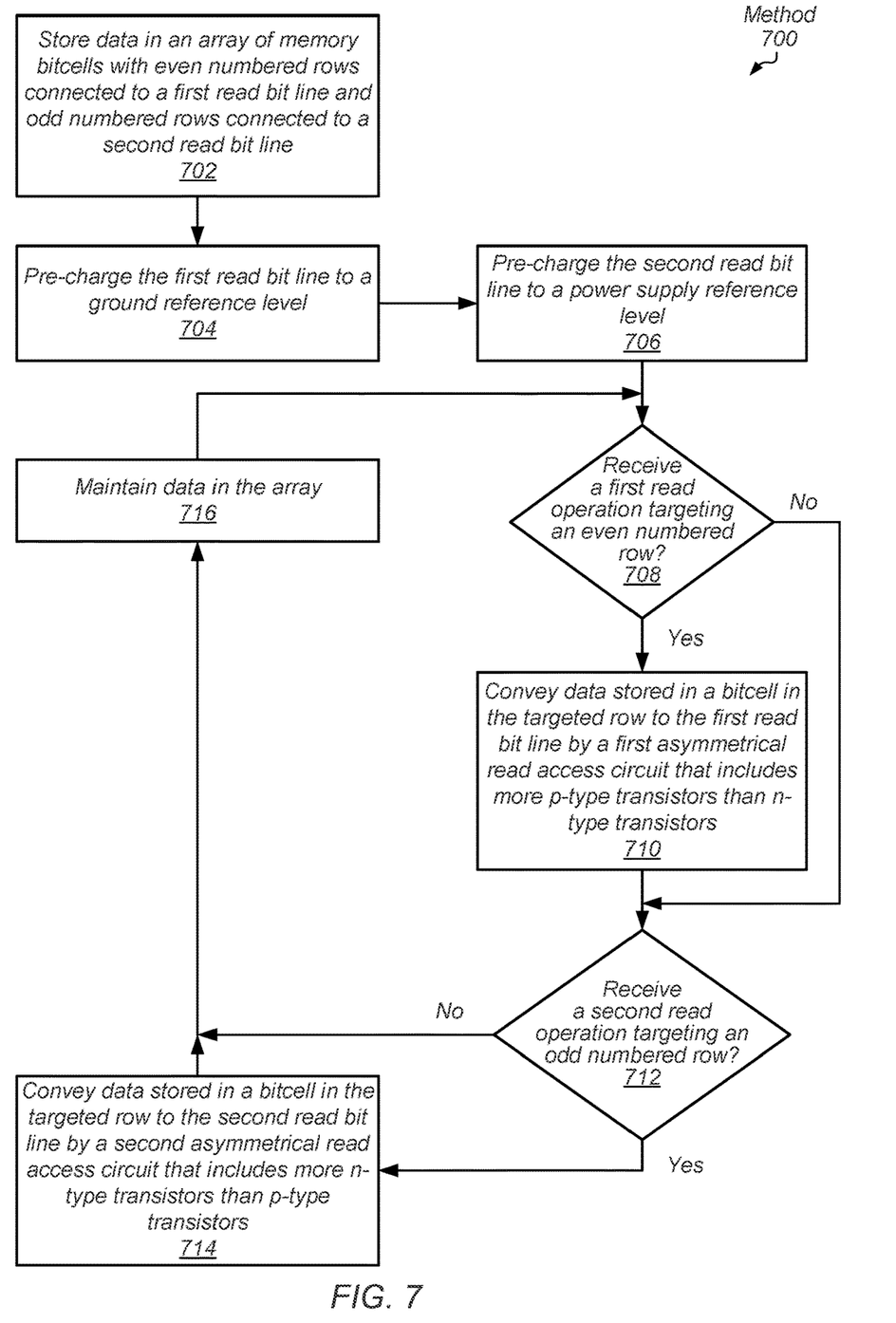
FIG. 7 is a generalized diagram of one implementation of a method for efficiently accessing data stored in a memory bit cell that includes an asymmetrical read access circuit and a split read port.

Referring now to FIG. 7, one implementation of a method 700 for efficiently accessing data stored in a memory bit cell is shown. For purposes of discussion, the steps in this implementation (as well as in FIG. 8) are shown in sequential order. However, in other implementations some steps occur in a different order than shown, some steps are performed concurrently, some steps are combined with other steps, and some steps are absent.

An array of memory bit cells arranged as multiple rows and columns stores data (block 702). In various implementations, the values of the stored data are maintained by data storage loops within the memory bit cells. In addition, the values of the stored data are updated by write operations. In some implementations, the memory bit cells include pass gates and feedback inverters (and feedback tristate inverters) to implement data storage loops and allow updating of the stored values during the write operations. In some implementations, the memory bit cells use the pass gates and feedback inverters of memory bit cell 100 (of FIG. 1) and memory bit cells 290 and 292 (of FIG. 2).

In various implementations, the array includes two or more split read ports. In an implementation, the array of memory bit cells has even numbered rows connected to a first read bit line and odd numbered rows connected to a second read bit line different from the first read bit line. In another implementation, the connections are reversed, and the array of memory bit cells have odd numbered rows connected to the first read bit line and even numbered rows connected to the second read bit line different from the first read bit line. Therefore, each of the first read bit line and the second read bit line include capacitive loading from half of the rows of the array, rather than include capacitive loading from each of the rows of the array.

These connections determine how each of the first read bit line and the second read bit line are pre-charged. In the following discussion, the connections between the even numbered rows and the first read bit line are used, although in other implementations, the reverse case is used with connections between the odd numbered rows and the first read bit line. Circuitry external to the memory bit cells pre-charges the first read bit line to a ground reference level (block 704). The circuitry pre-charges the second read bit line to a power supply reference level (block 706). Although a single read bit line is being described, each of the read bit lines of even numbered rows is pre-charged in a similar manner as the first read bit line, and each of the read bit lines of odd numbered rows is pre-charged in a similar manner as the second read bit line.

If the array receives a first read operation that targets an even numbered row of the array, which targets data to be read out on the first read bit line ("yes" branch of the conditional block 708), then a first asymmetrical read access circuit conveys data stored in a bit cell in the targeted row to the first read bit line (block 710). The first asymmetrical read access circuit includes more p-type transistors than n-type transistors. In some implementations, the first asymmetrical read access circuit includes only p-type transistors. For example, the memory bit cell includes a stack of p-type transistors such as p-type transistors 240 and 242 (of FIG. 2) that control whether the stored binary value affects the pre-charged read bit line RBLE 176. In an example, the targeted row is row 8 of rows 0-63 of the array, and the targeted row includes 32 memory bit cells that store a 32-bit data word. Each of the 32 memory bit cells of row 8 includes the first asymmetrical read access circuit. The first asymmetrical read access circuit of the memory bit cell corresponding to bit [4] of the 32-bit data word conveys data stored in bit cell [4] to the first read bit line routed in the column corresponding to bit [4]. Similarly, for row 8, the memory bit cells of bits [0-3] and bits [5-31] convey data to corresponding read bit lines routed in columns 0-3 and columns 5-31.

If the array does not receive the first read operation that targets an even numbered row of the array, which targets data to be read out on the first read bit line ("no" branch of the conditional block 708), then control flow of method 700 skips block 710 and moves to the conditional block 712. If the array receives a second read operation that targets an odd numbered row, which targets data to be read out on the second read bit line ("yes" branch of the conditional block 712), then a second asymmetrical read access circuit conveys data stored in the bit cell in the targeted row to the second read bit line (block 714). The second asymmetrical read access circuit includes more n-type transistors than p-type transistors. In some implementations, the second asymmetrical read access circuit includes only n-type transistors. For example, the memory bit cell includes a stack of n-type transistors such as n-type transistors 150 and 152 (of FIG. 1) that control whether the stored binary value affects the pre-charged read bit line RBLO 178.

In an example, the targeted row is row 21 of rows 0-63 of the array, and the targeted row includes 32 memory bit cells that store a 32-bit data word. Each of the 32 memory bit cells of row 21 includes the second asymmetrical read access circuit. The second asymmetrical read access circuit of the memory bit cell corresponding to bit [4] of the 32-bit data word conveys data stored in bit cell [4] to the second read bit line routed in the column corresponding to bit [4]. Similarly, for row 21, the memory bit cells of bits [0-3] and bits [5-31] convey data to corresponding read bit lines routed in columns 0-3 and columns 5-31. If the array does not receive the second read operation that targets an odd numbered row of the array, which targets data to be read out on the second read bit line ("no" branch of the conditional block 712), then control flow of method 700 skips block 714 and moves to the block 716. The bit cell maintains a stored binary value (block 716). For example, the bit cell includes a latch element for storing the binary value until the binary value is modified by a write access operation.

Figure 8:
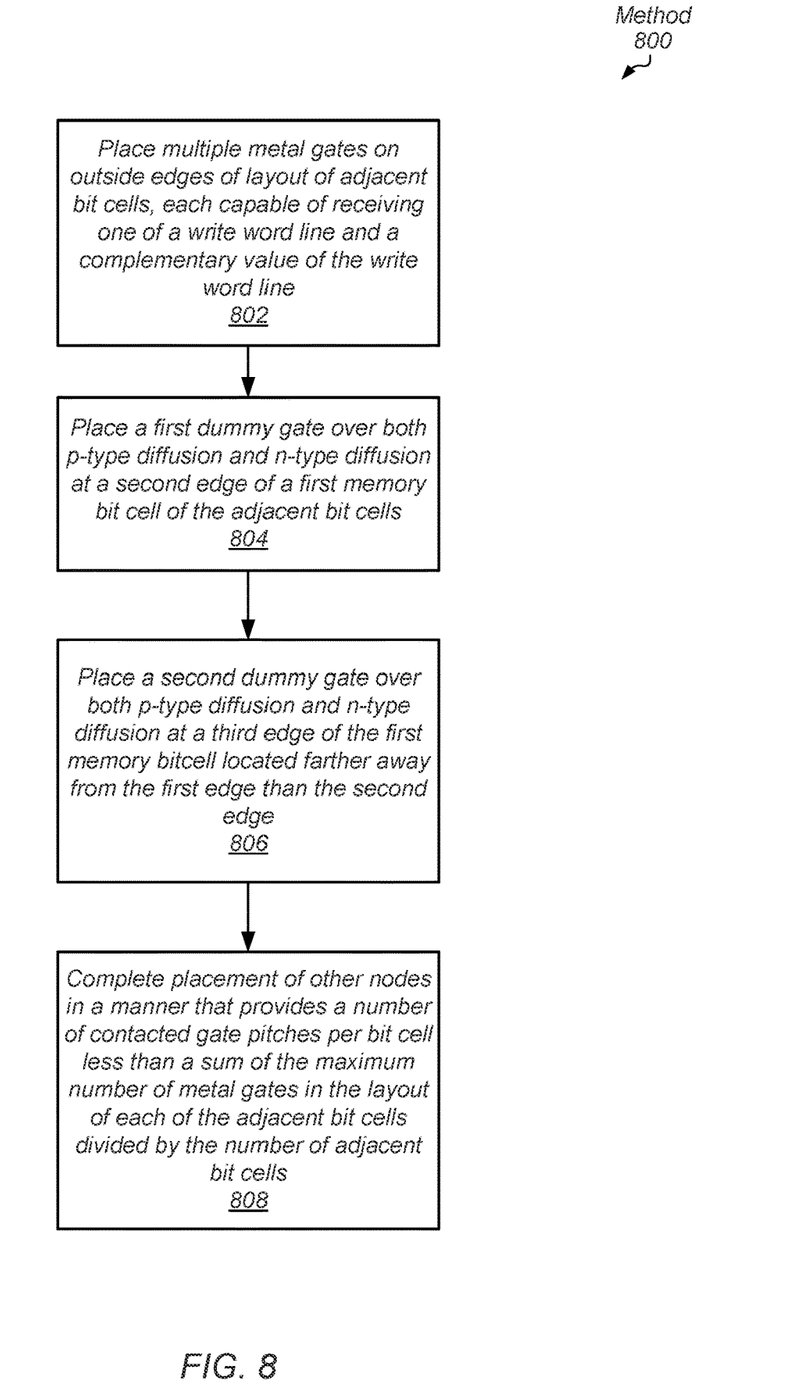
FIG. 8 is a generalized diagram of one implementation of a method for efficiently creating semiconductor layout of adjacent memory bit cells that utilize asymmetrical read access circuits and split read ports.

Referring now to FIG. 8, one implementation of a method 800 for efficiently creating semiconductor layout of adjacent memory bit cells is shown. The following steps create semiconductor layout of adjacent memory bit cells such as bit cells 200 (of FIG. 2) and bit cells of adjacent bit cells 712 (of FIG. 7). For example, the following steps create semiconductor layout of adjacent memory bit cells such as layout 400 (of FIG. 4). Multiple metal gates are placed on outside edges of layout of adjacent bit cells, each capable of receiving one of a write word line and a complementary value of the write word line (block 802). For example, metal gates 370, 371, 394 and 395 of layout 400 (of FIG. 4) are placed on the outermost edges of layout 400.

A first dummy gate is placed over both p-type diffusion and n-type diffusion at a second edge opposite the first edge of layout of a first memory bit cell of the adjacent bit cells (block 804). For example, dummy gate 376 of layout 400 (of FIG. 4) is placed at the second edge over the p-type diffusion 302 between bit cells 290 and 292. A second dummy gate is placed over both p-type diffusion and n-type diffusion at the third edge, which is located farther away from the first edge than the second edge (block 806). Referring briefly again to the layout 300 and 400, the dashed boxes for the bit cells 290 and 292 illustrate the L-shaped layout and the different edges. As described earlier, a distance along the n-type diffusion 304 between the first edge and the third edge is greater than a distance along the p-type diffusion 302 between the first edge and the second edge. The placement of other nodes of the layout of the adjacent bit cells is completed in a manner that provides a number of contacted gate pitches per bit cell less than a sum of the maximum number of metal gates in the layout of each of the adjacent bit cells divided by the number of adjacent bit cells (block 808). An example of this calculation was described earlier regarding the layout 400 (of FIG. 4).

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. A circuit comprising:
an array of memory bit cells configured to store data arranged as a plurality of rows and a plurality of columns, wherein:
a first portion of the plurality of rows are connected to a first read bit line of a given column of the plurality of columns and not connected to a second read bit line of the given column of the plurality of columns; and
a second portion of the plurality of rows are connected to the second read bit line and not connected to the first read bit line; and
circuitry configured to pre-charge one of the first read bit line and the second read bit line to a power supply reference level and pre-charge the other one of the first read bit line and second read bit line to a ground reference level;
wherein in response to receiving an indication of a first read operation targeting a row of the first portion comprising a first memory bit cell, the array of memory bit cells is configured to convey first data stored in the first memory bit cell to the first read bit line via a first asymmetrical read access circuit.

2. The circuit as recited in claim 1, wherein:
the first portion of the plurality of rows comprises odd numbered rows of the plurality of rows; and
the second portion of the plurality of rows comprises even numbered rows of the plurality of rows.

3. The circuit as recited in claim 1, wherein in response to receiving a second read operation targeting a row of the second portion comprising a second memory bit cell, the array of memory bit cells is configured to convey second data stored in the second memory bit cell to the second read bit line via a second asymmetrical read access circuit different from the first asymmetrical read access circuit comprising more p-type transistors than n-type transistors.

4. The circuit as recited in claim 3, wherein the array of memory bit cells is configured to convey the first data and the second data in a same clock cycle.

5. The circuit as recited in claim 3, wherein the second asymmetrical read access circuit comprises only p-type transistors.

6. The circuit as recited in claim 1, wherein the first memory bit cell comprises a different number of transistors of a given type than a second memory bit cell adjacent to the first memory bit cell.

7. The circuit as recited in claim 5, wherein the circuit further comprises circuitry configured to pre-charge the first read bit line to a power supply reference level and pre-charge the second read bit line to a ground reference level.

8. The circuit as recited in claim 5, wherein the second asymmetrical read access circuit comprises:
a first p-type transistor configured to receive, on its gate terminal, a complementary value of the data stored by a data storage circuit; and
a second p-type transistor in series with the first p-type transistor configured to:
receive, on its gate terminal, a read word line as the indication of the second read operation; and
receive, on its drain terminal, the second read bit line.

9. A method comprising:
storing data in an array of memory bit cells arranged as a plurality of rows and a plurality of columns, wherein:
a first portion of the plurality of rows are connected to a first read bit line of a given column of the plurality of columns and not connected to a second read bit line of the given column of the plurality of columns; and
a second portion of the plurality of rows are connected to the second read bit line and not connected to the first read bit line; and
pre-charging one of the first read bit line and the second read bit line to a power supply reference level and pre-charging the other one of the first read bit line and second read bit line to a ground reference level;
wherein in response to receiving an indication of a first read operation targeting a row of the first portion comprising a first memory bit cell, conveying first data stored in the first memory bit cell to the first read bit line via a first asymmetrical read access circuit.

10. The method as recited in claim 9, wherein:
the first portion of the plurality of rows comprises odd numbered rows of the plurality of rows; and
the second portion of the plurality of rows comprises even numbered rows of the plurality of rows.

11. The method as recited in claim 9, wherein in response to receiving a second read operation targeting a row of the second portion comprising a second memory bit cell, the method further comprises conveying second data stored in the second memory bit cell to the second read bit line via a second asymmetrical read access circuit different from the first asymmetrical read access circuit comprising more p-type transistors than n-type transistors.

12. The method as recited in claim 11, further comprising conveying, by the array of memory bit cells, the first data and the second data in a same clock cycle.

13. The method as recited in claim 11, wherein the second asymmetrical read access circuit comprising only p-type transistors.

14. The method as recited in claim 9, wherein first memory bit cell comprises a different number of transistors of a given type than a second memory bit cell adjacent to the first memory bit cell.

* * * * *